US006589715B2

(12) United States Patent
Joubert et al.

(10) Patent No.: US 6,589,715 B2
(45) Date of Patent: Jul. 8, 2003

(54) PROCESS FOR DEPOSITING AND DEVELOPING A PLASMA POLYMERIZED ORGANOSILICON PHOTORESIST FILM

(75) Inventors: Olivier Joubert, Meylan (FR); Cedric Monget, Grenoble (FR); Timothy Weidman, Sunnyvale, CA (US); Dian Sugiarto, Union City, CA (US); David Mui, San Jose, CA (US)

(73) Assignees: France Telecom, Meylan Cedex (FR); Applied Materials, Inc., Santa Clara, CA (US)

( * ) Notice: Subject to any disclaimer, the term of this patent is extended or adjusted under 35 U.S.C. 154(b) by 128 days.

(21) Appl. No.: 09/810,369

(22) Filed: Mar. 15, 2001

(65) Prior Publication Data

US 2001/0012592 A1 Aug. 9, 2001

Related U.S. Application Data

(62) Division of application No. 09/243,207, filed on Feb. 2, 1999, now Pat. No. 6,238,844.

(30) Foreign Application Priority Data

Mar. 11, 1998 (EP) .............................. 98400574

(51) Int. Cl.[7] .......................... G03F 7/36; H01L 21/302; C08F 2/46

(52) U.S. Cl. ....................... 430/316; 430/311; 430/313; 430/322; 430/323; 430/329; 216/67; 216/72; 438/714; 438/734; 438/735; 427/488; 427/489

(58) Field of Search ................................ 430/311, 313, 430/316, 322, 323, 329; 216/67, 72; 438/714, 734, 735; 427/488, 489

(56) References Cited

U.S. PATENT DOCUMENTS

| 4,560,641 A | 12/1985 | Kokaku et al. ............. 430/312 |
| 5,318,877 A | 6/1994 | Ober et al. ................. 430/270 |
| 5,346,803 A | 9/1994 | Crivello et al. ............ 430/270 |

(List continued on next page.)

FOREIGN PATENT DOCUMENTS

| JP | 58-111318 | 7/1983 | ........... H01L/21/30 |
| JP | 63-229452 | 9/1988 | ............ G03C/5/24 |
| JP | 2-101468 | 4/1990 | ............. G03F/7/38 |

OTHER PUBLICATIONS

T.W. Weidman et al., "All Dry Lithography: Applications of Plasma Polymerized Methylsilane as a Single Layer Resist and Silicon Dioxide Precursor," *Journal of Photopolymer Science and Technology*, vol. 8, No. 4, pp. 679–686 (1995).

(List continued on next page.)

*Primary Examiner*—Mark F. Huff
*Assistant Examiner*—Nicole Barreca
(74) *Attorney, Agent, or Firm*—Townsend and Townsend and Crew

(57) ABSTRACT

A process for etching a PPMS layer that increases the etch selectivity of PPMS relative to PPMSO from an initial low etch selectivity to a higher etch selectivity at a later stage of the etching process. In some embodiments, the etch selectivity used during a first etching step of the process is less than 4:1 and the etch selectivity used during a second etching step, subsequent to the first step, is greater than 5:1. In some other embodiments, the etch selectivity of the first step is between 2–3:1 and the etch selectivity of the second step is greater than 8:1. Optionally, in still other embodiments a third etching step, performed between the first and second etching steps may be employed where the etch selectivity is between 3–8:1.

17 Claims, 5 Drawing Sheets

U.S. PATENT DOCUMENTS

| | | |
|---|---|---|
| 5,439,780 A | 8/1995 | Joshi et al. .................. 430/296 |
| 5,487,967 A | 1/1996 | Hutton et al. ................ 430/322 |
| 5,635,338 A | 6/1997 | Joshi et al. .................. 430/325 |
| 5,925,494 A | 7/1999 | Horn ........................ 430/270.1 |
| 6,013,418 A | 1/2000 | Ma et al. ..................... 430/323 |
| 6,204,168 B1 * | 3/2001 | Naik et al. ................... 438/638 |
| 2001/0012592 A1 * | 8/2001 | Joubert et al. ................. 430/5 |

OTHER PUBLICATIONS

M.W. Horn et al., "Plasma–Deposited Organosilicon Thin Films As Dry Resists for Deep Ultraviolet Lithography," *J. Vac. Sci. Technol. B.*, vol. 8, No. 6, pp. 1493–1496 (Nov./Dec. 1990).

O. Joubert et al., "Application of Plasma Polymerized Methylsilane in an All Dry Resist Process for 193 and 248 nm Lithography," *Microelectronic Engineering*, vol. 30, No. 1/04, pp. 275–278 (Jan. 1996).

Anonymous, "Preparing Resists for Sculpturing Wall Profiles of Resists," *IBM Technical Disclosure Bulletin*, vol. 20, No. 9, pp. 3709–3712 (Feb. 1978).

* cited by examiner

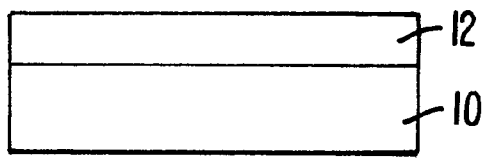
FIG. 1A. PRIOR ART — PPMS DEPOSITION
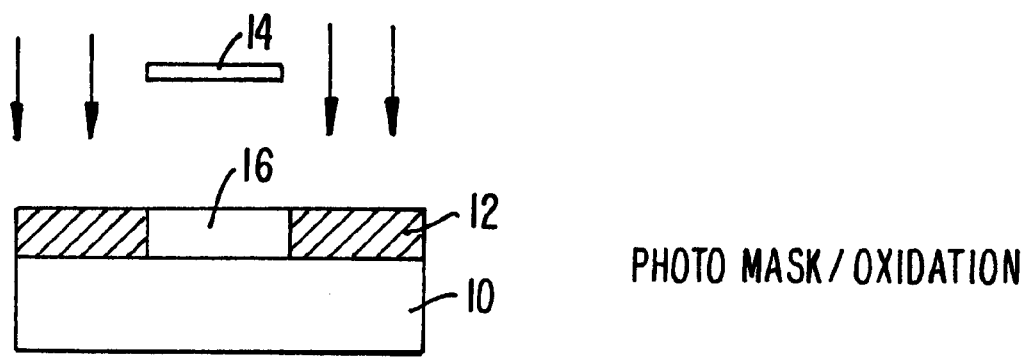
FIG. 1B. PRIOR ART — PHOTO MASK / OXIDATION
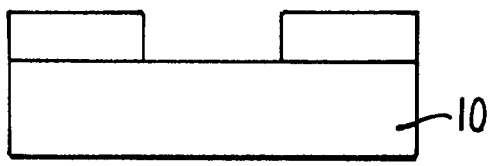
FIG. 1C. PRIOR ART — CHLORINE PLASMA
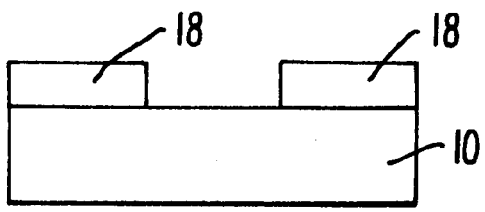
FIG. 1D. PRIOR ART — OXYGEN PLASMA

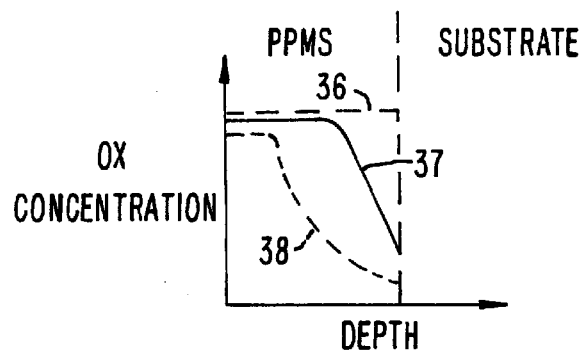
FIG. 2B.
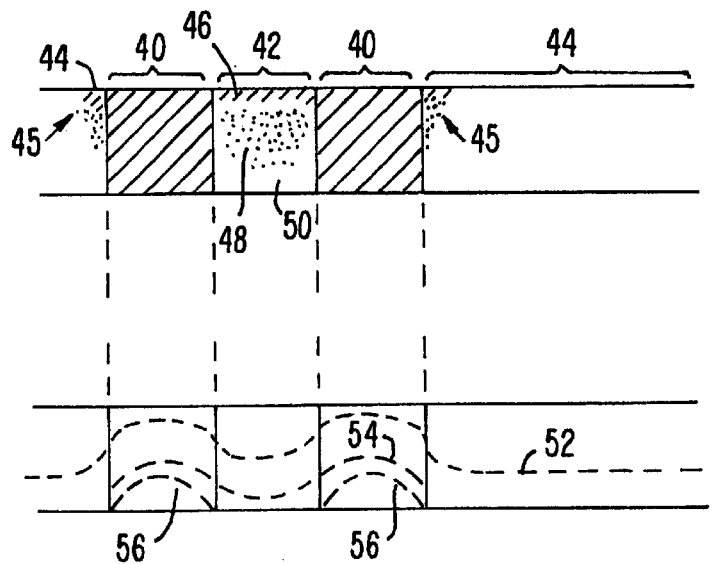
FIG. 3A.
FIG. 3B.
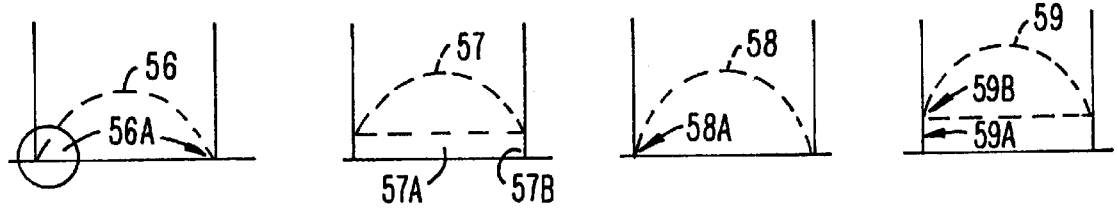
FIG. 4A.   FIG. 4B.   FIG. 4C.   FIG. 4D.

PROCESS FOR DEPOSITING AND DEVELOPING A PLASMA POLYMERIZED ORGANOSILICON PHOTORESIST FILM

This application is a division of and claims the benefit of U.S. application Ser. No. 09/243,207, filed Feb. 2, 1999, now U.S. Pat. No. 6,238,844, the disclosure of which is incorporated by reference.

BACKGROUND OF THE INVENTION

The present invention relates generally to photolithographic semiconductor processing techniques and more particular to a method and apparatus for depositing and developing a photoresist film.

The patterning of various deposited layers using photolithography techniques are common steps in the formation of today's integrated circuits. Over the years a variety of photolithographic processes have been developed. One of the more common of these processes includes the deposition of an initial antireflective coating (ARC layer) under a spin-on resist layer. The spin-on resist layer is a light-sensitive material and is therefore referred to as a photoresist layer. After deposition of the photoresist, a photomask (also known simply as a mask) having transparent and opaque regions that embody a desired pattern is used to pattern the photoresist. When the mask is exposed to light (e.g., ultraviolet light), the transparent portions permit the exposure of the photoresist in those regions, but not in the regions where the mask is opaque. The light causes a chemical reaction in exposed portions of the photoresist. A suitable chemical solution, chemical vapor or plasma process is then used to selectively attack (etch away) either the reacted or unreacted portions of the photoresist. This process is known as developing the photoresist. With the remaining photoresist acting as a mask, the underlying layer may then undergo further processing. For example, material may be deposited, the underlying layer may be etched or other processing carried out.

The deposition of such spin-on resist layers is a wet chemical process that has limitations that make the process undesirable for some applications.

Newer photolithography techniques include the deposition of a plasma polymerized methylsilane (PPMS) photoresist layer from a chemical vapor deposition process. PPMS is an amorphous methyl silicon polymer, and PPMS deposition techniques have been previously described in an article by Weidman et al., entitled "New Photodefinable Glass Etch Masks for Entirely Dry Photolithography: Plasma Deposited Organosilicon Hydride Polymers," published in *Applied Physics Letters,* vol. 62, no. 4, Jan. 25, 1993, pgs. 372–374; U.S. Pat. No. 5,439,780 to Joshi et al.; and an article by Weidman et al. entitled "All Dry Lithography: Applications of Plasma Polymerized Methylsilane as a Single Layer Resist and Silicon Dioxide Precursor," published in *Journal of Photopolymer Science and Technology,* vol. 8, no. 4, (1995), pgs. 679–686. Additionally, a commercially viable PPMS photolithography technique in which a deposited PPMS film has good stability, high photosensitivity and a high deposition rate is described in U.S. Ser. No. 08/745,565, filed Nov. 8, 1996, entitled "Method and Apparatus for Depositing Deep UV Photoresist Film," and having Timothy Weidman and Dian Sugiarto listed as co-inventors. The Ser. No. 08/745,565 application is assigned to Applied Materials, an applicant for the present patent, and is hereby incorporated by reference in its entirety.

As described in these references, a PPMS film having an amorphous organosilicon hydride network structure is deposited by plasma polymerization of a methylsilane precursor gas. When the PPMS film is exposed to deep UV radiation in the presence of an oxidant such as ambient air, exposed portions of the PPMS film undergo photo-oxidation to form a glass-like, siloxane network material, plasma polymerized methylsilicon oxide (PPMSO). The resulting patterns can be developed to provide either negative tone or positive tone patterns. Negative tone patterns are generally formed using a chlorine-based plasma etch. Positive tone patterns can be formed using an HF vapor or buffered oxide etch. In either case, the developed pattern may optionally be further oxidized and annealed to convert the remaining material to a hard oxide suitable for further processing. Such PPMS photolithography techniques are advantageous in that the deposition, development, patterning, and etching steps may all be performed in the gas phase, i.e., using dry plasma processing techniques, providing very high resolution.

The process described in the Ser. No. 08/745,565 application described above is useful for a variety of photolithography applications. Despite this, improvements to these known PPMS deposition processes are desirable.

SUMMARY OF THE INVENTION

The present invention provides an improved photolithography process that enables definition of patterns that have improved line roughness, resolution and critical dimension uniformity and control as compared to previously known PPMS processes.

In one embodiment, the present invention provides a process for patterning a feature on a substrate using a plasma polymerized methylsilane (PPMS) photoresist layer or similar organosilicon film. The process includes the step of depositing a PPMS film having upper and lower strata such that the upper stratum is more photosensitive to ultraviolet radiation than is the lower stratum. In one version of this embodiment, the upper and lower strata are formed in a multistep deposition process that, preferably, takes place in a single deposition chamber. In another version of this embodiment, the upper and lower strata are formed by a process in which deposition parameters are modified to deposit a PPMS layer having a photosensitivity gradient between the upper and lower strata. In still another version of this embodiment, various intermediate strata are formed. Preferably, each intermediate stratum has a photosensitivity that is higher than the stratum directly beneath it.

In another embodiment, the present invention provides a multistep process for etching a PPMS layer that increases the etch selectivity (the etch ratio of an unoxidized PPMS film relative to an oxidized PPMSO film) from an initial low etch selectivity to a higher etch selectivity at a later stage of the etching process. In one currently preferred version of this embodiment, the etch selectivity used during a first etching step of the process is about 4:1 or less and the etch selectivity used during a second etching step, subsequent to the first step, is about 5:1 or more. In an even more preferred version of this embodiment, the etch selectivity of the first step is between 2–3:1 and the etch selectivity of the second step is greater than 5:1. Optionally, a third etching step, performed between the first and second etching steps, may be employed where the etch selectivity is between 3–4:1. In another version of this embodiment, the etch selectivity is varied along a gradient, e.g., linearly, throughout the etching process from a low etch selectivity to a higher etch selectivity.

These and other embodiments of the present invention, as well as its advantages and features, are described in more detail in conjunction with the text below and attached figures.

BRIEF DESCRIPTION OF THE DRAWINGS

FIGS. 1A through 1D are simplified cross-sectional drawings illustrating the steps of a previously known single layer PPMS negative tone development application;

FIG. 2B is a graph illustrating the difference in oxygen concentration between fully oxidized and partially oxidized areas of a substrate after a photo-oxidation step;

FIG. 3A is a simplified cross-sectional view of a PPMS layer having fully oxidized, partially oxidized and unoxidized areas after a photo-oxidation step;

FIG. 3B is a simplified cross-sectional view of the PPMS layer of FIG. 5A as it undergoes pattern development;

FIGS. 4A–4D are simplified cross-sectional views comparing a PPMSO layer developed without the benefits of the present invention to PPMSO layers developed according to different embodiments of the present invention;

DESCRIPTION OF THE SPECIFIC EMBODIMENTS

Figure 2A:
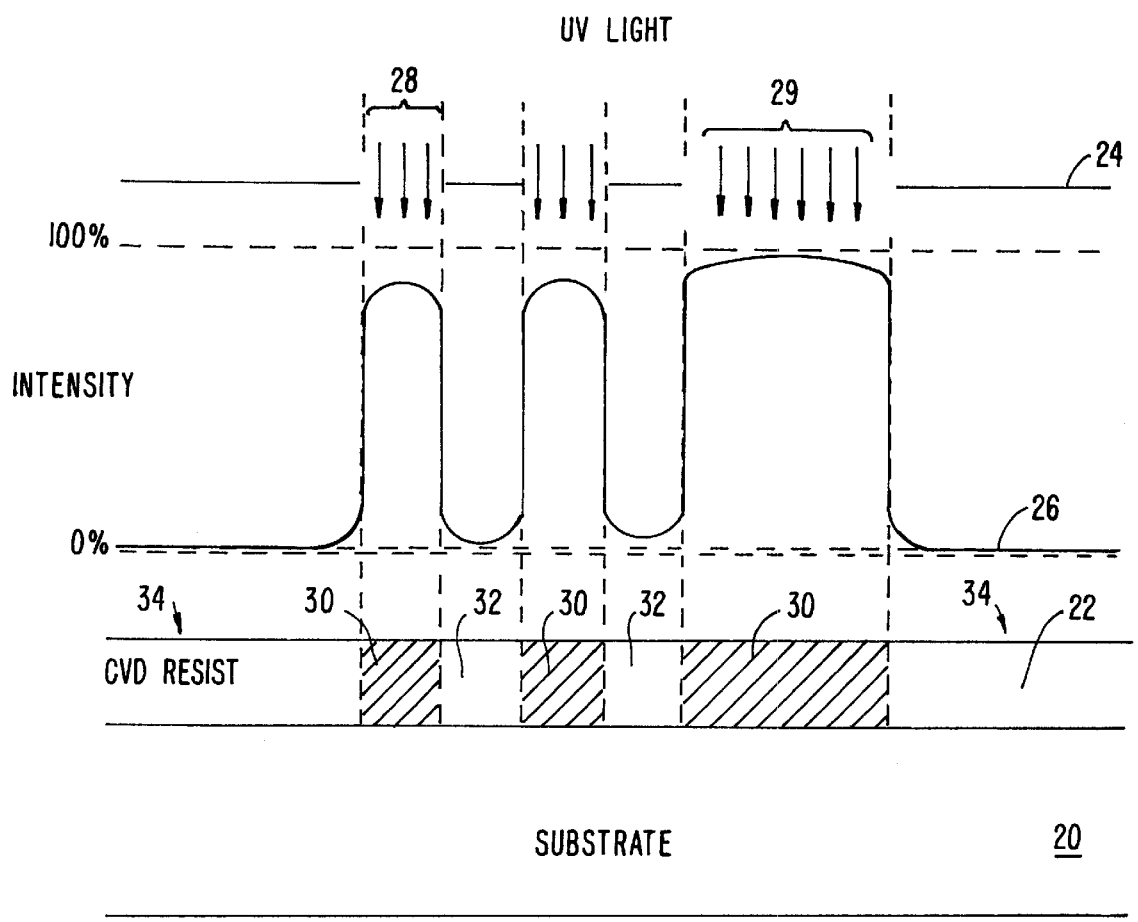
FIG. 2A is a pictorial representation of a substrate as it undergoes a photoinduced oxidation process.

The present invention provides a process for forming a patterned oxide layer on a semiconductor substrate. The process generally comprises the steps of depositing a plasma polymerized organosilicon film, photo-patterning the film to form oxide regions, and developing the patterned film by selectively etching non-oxidized regions of the photo-patterned film with a chlorine or similar plasma. The developed oxide film can include vias, trenches, and/or other apertures for construction of devices on the substrate or for use as a hard mask for etching one or more sublayers.

The PPMS deposition and subsequent development process of the present invention is compatible with both 248 nm and 193 nm deep UV (DUV) exposure tools, and can be performed using commercially available substrate processing equipment. For example, the PPMS layer can be deposited in a single wafer cluster tool such as the P5000 or Centura deposition systems manufactured by Applied Materials when outfitted with a resistively-heated DxZ chamber. Patterning can be done on an ASML/300 DUV system manufactured by ASML, and the patterned layer can be developed in a high density plasma DPS etching chamber also manufactured by Applied Materials. The process of the present invention is useful in the patterning of feature sizes in devices manufactured using sub 0.25 um design rules, and it is believed that the presently disclosed PPMS process can be employed in the printing of feature sizes as small as 0.10 um or less when patterned with a 193 nm DUV tool using resolution enhancement techniques.

The present invention provides improved resolution, line roughness and critical dimension uniformity and control as compared to previously known PPMS photolithography techniques. Additionally, in the development of a PPMS layer of a given thickness, the PPMSO layer remaining after the completion of the development process is thicker when the process of the present invention is used to deposit and/or develop the PPMS layer than when previously known processes are employed. Generally, a thicker PPMSO layer provides a better etch mask layer for the next level than does a thinner layer.

In order to better appreciate this present invention, reference is first made to FIGS. 1A through 1D, which are simplified cross-sectional drawings illustrating the steps of a previously known, single layer PPMS, negative tone development application. In FIG. 1A a PPMS layer 12 is shown deposited over a bare substrate 10. Layer 12 is then subjected to a photoinduced oxidation process as shown in FIG. 1B. In the process, PPMS layer 12 is exposed to DUV in the presence of oxygen (e.g., ambient air). A mask 14 blocks the DUV from an area 16 of the PPMS layer. Thus ideally, area 16 is not oxidized while the remainder of PPMS layer 12 is oxidized to form regions of PPMSO. Next, as shown in FIG. 1C, the substrate is exposed to a chlorine etching process to remove unoxidized area 16 from the substrate. Finally, the substrate is exposed to an oxygen plasma to harden the film and form a patterned oxide film 18 shown in FIG. 1D. Patterned oxide film 18 can be used in applications such as shallow trench isolation and gate formation among others.

The description of FIGS. 1A through 1D is based on an ideal process. In actual processes, such sharp contrasts between areas of full oxidization and no oxidation do not exist. Instead, the oxidized and unoxidized areas are separated by areas of partial oxidation. The partial oxidation areas are created in the masked regions of a substrate, with the phenomenon being particularly pronounced in areas of substrates having densely packed features, e.g., features separated by the minimum design rule geometry of the process. A description of these areas of partial oxidation will now be made with reference to FIGS. 2A and 2B.

FIG. 2A is a pictorial representation of a substrate 20 as it undergoes a photoinduced oxidation process. In FIG. 2A, a PPMS layer 22 deposited over substrate 20 is exposed to deep UV light through a mask 24. Due to mask diffraction effects, the amount of UV light that reaches each area of the substrate (represented by line 26) varies from an intensity level of between 0% and 100% depending on the position of a given substrate area to one or more of the openings in mask 24.

Line 26 indicates that areas of the substrate in the middle of larger openings (e.g., area 29 which is about three times as wide as area 28) of mask 24 receive a dosage of UV light at close to a 100% intensity level. Regions near the edges of openings in mask 24 and regions in the middle of smaller openings in the mask, receive a dosage of UV light that is considerably less than 100%. Similarly, UV light is almost entirely blocked in regions of the substrate that are positioned below the wider blocking areas of mask 24. A partial dosage of UV light, however, reaches areas of the substrate that are blocked by the more densely packed blocking portions of mask 24. This partial dosage is dependent on the pitch of the densely packed features.

The net result of this phenomenon is that areas of partial oxidation are formed in PPMS layer 22 as the layer undergoes the photoinduced oxidation process. The amount of oxidation within layer 22 is generally represented by the density of dots depicted in a given area. Thus, for example, areas 30 of layer 22 are fully oxidized, while areas 32 are partially oxidized and areas 34 remain unoxidized.

FIG. 2B shows a more accurate representation of the oxygen concentration within fully oxidized areas 30 and partially oxidized areas 32. In FIG. 2B, line 36 represents an ideal profile of oxygen concentration versus depth in an exposed area 34 of layer 22. Line 37, on the other hand, is representative of an actual profile of oxygen concentration versus depth that may occur in fully oxidized area 30. Complete oxidation may not occur near the bottom of area 30 in some instances because the reaction becomes oxygen diffusion limited at a certain depth at the exposure dose. Increasing the exposure dosages could promote further oxidation, but may also result in undesirable reflected light.

In area 32, an upper stratum, e.g., the top 200–300 Å of the layer, is almost fully oxidized, while an intermediate stratum immediately below this upper stratum is partially oxidized. A oxygen concentration profile representative of area 32 is shown in FIG. 2B as line 38.

The partial oxidation of areas near the edges of openings in mask 24 and in the areas of the substrate blocked by smaller width portions of mask 24 present a problem in that etch selectivity between partially exposed PPMS and the edge areas of the PPMSO layers is greatly reduced in areas of dense features. A reduction in etch selectivity between these PPMS and PPMSO areas may result in the creation of rough edges along the patterned features defined by mask 24. The formation of these rough edges is described with respect to FIGS. 3A and 3B.

FIG. 3A shows fully oxidized areas 40, a partially oxidized area 42 and unoxidized areas 44 of a patterned PPMS layer. Partially oxidized area 42 includes an upper fully oxidized stratum 46, a middle partially oxidized stratum 48 and a lower unoxided stratum 50. Similarly, unoxidized areas 44 may include small areas of full and partial oxidation 45 near the upper corners of area 44 that border oxidized regions 40.

Figure 5A:
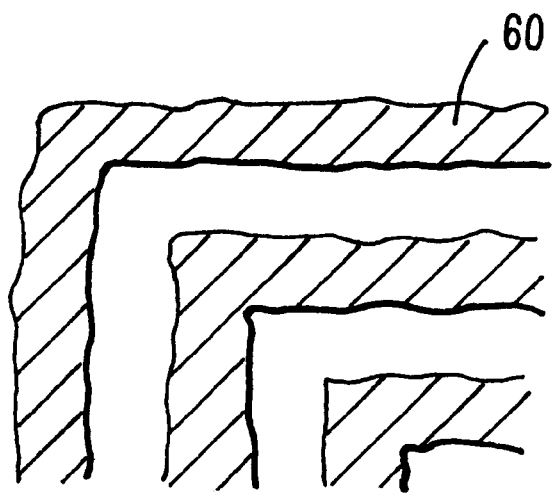
FIG. 5A is an example of the formation of rough edges between adjacent patterned oxide lines formed over a substrate.
Figure 5B:
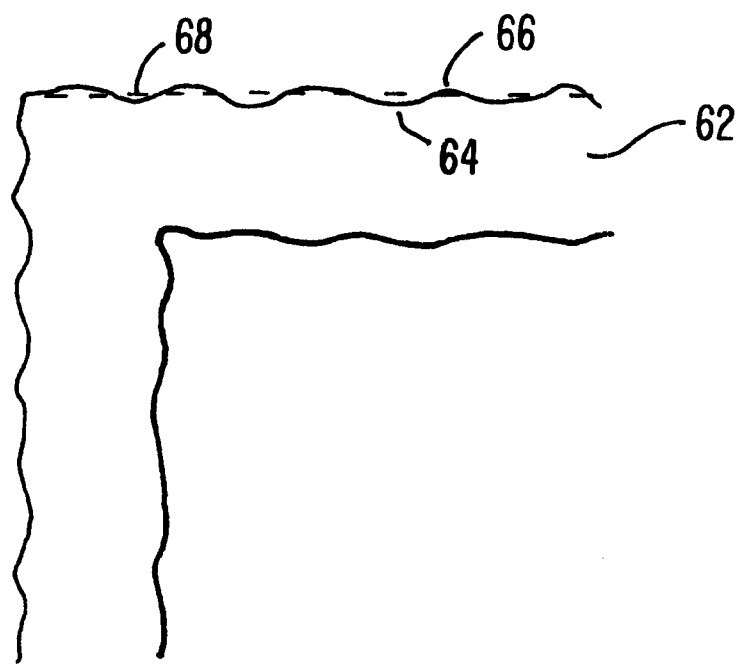
FIG. 5B is a further magnified, top view of one of the lines shown in FIG. 3A.

FIG. 3B shows the effect of a standard plasma chlorine etching step having a fixed PPMS/PPMSO etch selectivity on this substrate. In FIG. 5B, line 52 represents the topography of the PPMS layer after an initial stage (e.g., the midpoint) of the etching process. Further etching results in the topography represented by line 54. At this stage, the unoxidized PPMS layer in regions 44 is completely removed, but there is still unetched material remaining in partially oxidized region 42.

It is important to completely remove the PPMS material from all of areas 42 and 44. Thus, an overetching time is typically included in the etching process to ensure that the PPMS material in area 42 is also fully removed. This overetching time is often on the order of 30–70 percent of the total etch time. This additional etching of the PPMS material in region 42 may result in overetching of the layer below the PPMS layer in areas 44 and in narrowing of the PPMSO masking regions in areas 40 as shown by line 56.

The narrowing of the PPMSO masking regions is better shown in FIG. 4A, which is a magnified view of the PPMSO material remaining in one of the regions 40 in FIG. 3B after completion of the development process. As shown in FIG. 4A, the profile 56 of the remaining PPMSO layer includes edge portions 56A near the borders of regions 42 and 44. Because of the relatively shallow angle of profile 56 relative to the underlying layer, edge portions 56A are very sensitive to etch conditions. That is, the alignment of the edge along the length of a given patterned line is rather moveable.

The "moveability" of the edge of the line is a direct cause of edge roughness. An example of the rough edges that may be formed from the PPMSO profile of FIG. 4A is shown in FIG. 5A where adjacent patterned oxide lines 60 are formed over a substrate. As shown in FIG. 5B, which is a top view at an increased magnification of one of lines 60 from FIG. 5A, each of lines 60 has edges 62 that include indentions 64 and outdentions 66. Ideally, the edges of lines 60 should be as close to dotted line 68 as possible.

It is worth noting that lines exhibiting a surface roughness similar to that of lines 60 are adequate for many applications. As features sizes continue to decrease to 0.25 um, 0.18 um and 0.15 um or smaller, however, it can be important to improve the edge roughness of lines 60 for some applications.

The present inventors have developed two separate techniques that can be used independent of each other or in combination with each other to further improve the edge roughness of lines 60 and other characteristics of the development process. The first technique includes deposition of a PPMS film having a bottom stratum that has decreased photosensitivity as compared to a top stratum of the film. The second technique etches the photo-oxidized layer with an etching chemistry that has a varied etch selectivity over the duration of the etching process. More specifically, the etching process increases the etch selectivity (defined as the ratio of the etch rate of PPMS to the etch rate of PPMSO) from an initial low etch selectivity to a higher etch selectivity used at a later stage of the etching process.

With regard to the improved deposition technique, the inventors have discovered that varying the photosensitivity of a deposited PPMS film along the depth of the film from a very low photosensitivity (at the bottom) to a very high photosensitivity (at the top) can significantly improve the roughness along the edges of patterned features.

It has been found that a low photosensitivity PPMS film can be deposited by increasing the density of the film. Thus, there is a trade-off between stability, which is directly related to film density, and the photosensitivity of a film. Highly photosensitive films are relatively unstable (i.e., have a significant or appreciable refractive index evolution observed as a function of time). Conversely, films having a low photosensitivity are highly stable (i.e., have little or no refractive index evolution observed as a function of time). It is believed that at higher density levels, oxygen cannot enter the film and thus cannot initiate the PPMS to PPMSO conversion process that takes place in a more photosensitive PPMS film.

There are a number of deposition parameters that can be varied to deposit a denser and therefore less photosensitive PPMS film. These parameters include increasing the RF power used to form a plasma thereby increasing the plasma density, decreasing the chamber pressure, altering the flow rate of methylsilane and increasing the substrate temperature. Currently preferred embodiments increase the RF power while decreasing the chamber pressure to densify the film. Chamber temperature is not varied in these embodiments because of the time it takes for the substrate to stabilize at a new deposition temperature. Also, varying flow rate to alter film photosensitivity is less preferred. The inventors have found that photosensitivity is less sensitive to gas flow rate than other deposition conditions. Accordingly, flow rate variation is primarily used to optimize film properties rather than alter film photosensitivity.

Figure 6:
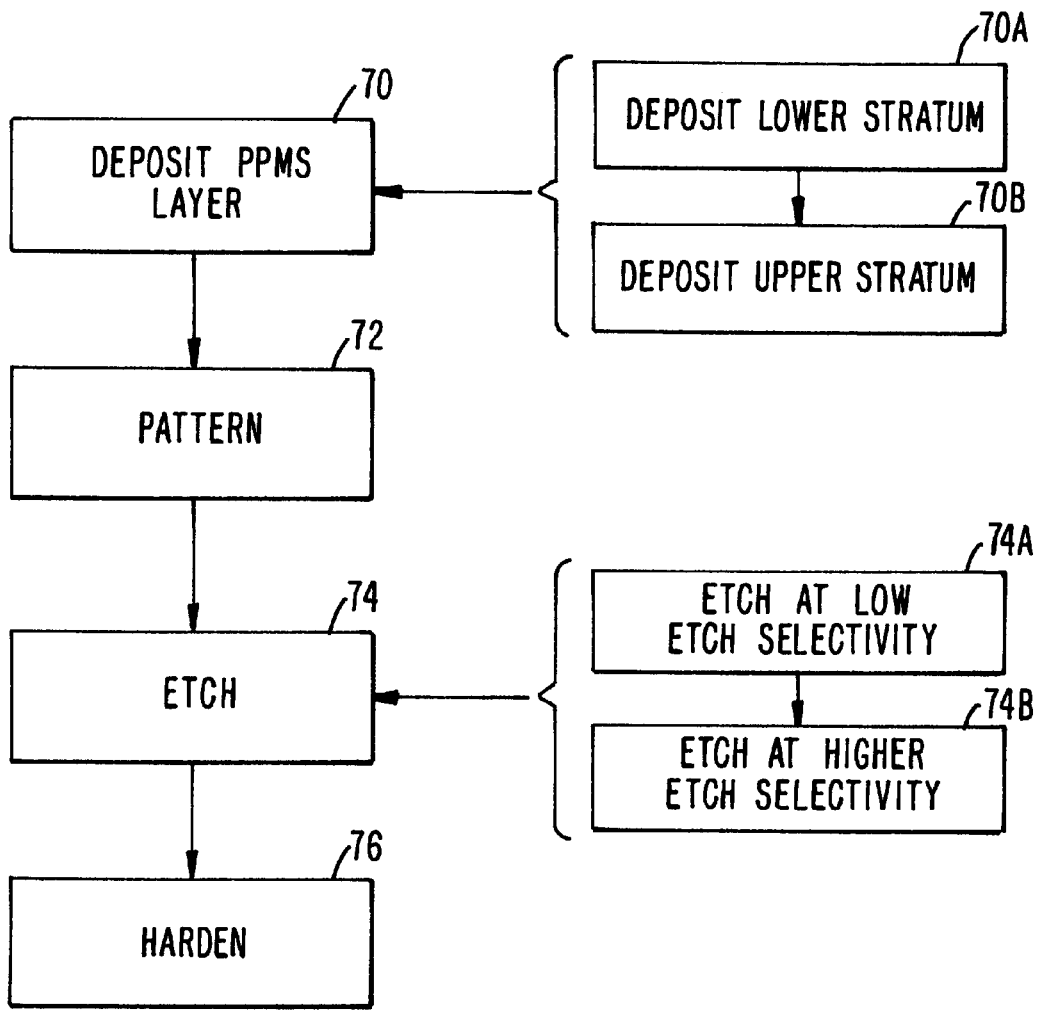
FIG. 6 is a flow chart illustrating the process steps according to one embodiment of the present invention.

The process of the present invention will now be described in more detail in conjunction with FIG. 6, which is a flow chart depicting the steps of a currently preferred embodiment of the present invention. As shown in FIG. 6, the process of the present invention includes three primary steps: a PPMS deposition step 70, a patterning step 72 and a developing step 74; along with an optional step 76 in which a patterned and developed PPMSO layer is hardened into a patterned oxide layer.

According to the present invention, PPMS deposition step 70 includes substeps 70A and 70B in which the lower and upper strata of the PPMS layer are deposited in that order. Substeps 70A and 70B are not necessarily two discrete steps. Instead, substeps 70A and 70B are representative of the formation of a PPMS film having at least upper and lower strata with different photosensitivity values. In one embodiment, a different layer of the PPMS film is deposited in each of steps 70A and 70B. The different layers can be deposited in different deposition chambers, or preferably, in an in-situ process in the same deposition chamber. In another embodiment, additional layers are deposited between the layers in steps 70A and 70B to create a PPMS film having three or more distinct layers. Preferably, the photosensitivity of each of the different layers increases toward the upper surface of the PPMS layer.

In still another embodiment, steps 70A and 70B represent the changing of process conditions during the continuous deposition of a single PPMS layer in a single substrate processing chamber. Initially, process conditions are set to favor deposition of a photoinsenstive film to deposit the lower stratum of the PPMS layer. Then, at a subsequent stage of deposition, process conditions are changed to favor the formation of a highly photosensitive PPMS layer. This embodiment can be further modified to so that deposition conditions are changed numerous times or continuously to form either a plurality of different strata within the PPMS layer or an almost continuous gradient, from the bottom of the film to the top, of low photosensitivity film to high photosensitivity film.

In step 70B, the upper stratum of the PPMS film is generally deposited according to the process disclosed in the Ser. No. 08/745,565 application previously incorporated by reference. It is important that the upper stratum have good photosensitivity characteristics. Otherwise, the PPMS layer will have poor film photo-oxidation under exposure, which ultimately leads to a poor etch selectivity between exposed (PPMSO) and unexposed (PPMS) regions of the film.

Irrespective of the difference in photosensitivity among the upper and lower strata of the PPMS layer, it is preferred that other characteristics of the film (e.g., etch selectivity, refractive index and optical density) remain as similar as possible. If the materials of the upper and lower strata are not similar in refractive index before the films are developed, reflection of UV light between the layers could severely impair the accuracy and other properties of the lithography process.

The lower stratum of the PPMS film is deposited in step 70A at an increased RF power (e.g., 120 Watts versus 60 Watts) and a decreased pressure (e.g., 1.4 Torr versus 2.2 Torr) as compared to step 70B. By using such deposition parameters, the lower stratum of the PPMS layer can be made to exhibit almost no photosensitivity. This, in turn, ultimately leads to little or no oxidation in the lower stratum of the film during the development process and helps prevent overetching of the stratum of the PPMS layer under the developed PPMSO areas.

FIG. 4B shows the resulting profile 57 of a developed PPMSO layer that was initially deposited using a two-step deposition process according to the present invention. In FIG. 4B, a stratum 57A of the remaining PPMSO layer represents unoxidized PPMS. The existence of layer 57A allows the bias RF power to be kept relatively high during the development process while maintaining a high etch selectivity by increasing the $O_2$ flow. Developing at a high bias RF creates a more anisotropic etch (hence the vertical edges 57B) allowing for the creation of a better mask profile. Profile 57 is less "moveable" than profile 56 and thus provides better edge roughness characteristics. Without unoxidized stratum 57A, the developing process would require the use of a lower bias RF power to maintain a similar etch selectivity.

When a two-step deposition process is employed for steps 70A and 70B, the inventors have discovered that it is desirable to have the lower layer deposited to a thickness that is about equal to or greater than the upper layer. For example, when the overall thickness of the PPMS layer is 2000 Å, the inventors have found that better edge roughness can be obtained when the upper and lower layers are about 1000 Å each as compared to an upper layer of 1500 Å and a lower layer of 500 Å.

In currently preferred embodiments, the photosensitivity of the lower layer is such that, a single PPMS layer of the same photosensitivity is, by itself, insufficient for photolithographic applications. The photosensitivity can be determined by measuring the refractive index (RI) of the film before and after exposure to UV radiation. For example, the present inventors exposed 1000 Å PPMS films to a 10 $mJ/cm^2$ dose of UV radiation from a 220 nm UV lamp for one second. A 1000 Å film exhibiting a change in the RI of the film from 1.73 to 1.54 is sufficiently photosensitive to be used for the top layer of the PPMS film deposited in step 70. 1000 Å films exhibiting a change in the RI of the film from 1.73 to 1.63 and from 1.78 to 1.65 are sufficiently inphotosensitive to be used for the bottom layer of the PPMS film.

With regard to the improved etching technique, the inventors have found that the starting the etching process using a low selectivity etching condition between the PPMS/PPMSO areas and then subsequently using a higher selectivity etching condition between the areas can also help prevent the problems associated with partial oxidation of the PPMS areas in high feature density portions of a substrate as illustrated in FIG. 3A.

The multistep etching solution includes initiating the etching process in a low etch selectivity condition in step 74A. In this manner the undesirable, fully oxidized stratum 46 of region 42 is removed at close to the same rate as the unoxidized area 44. The etching selectivity can then be increased in step 74B as stratum 46 is removed and can still be increased further as stratum 48 is removed. As with deposition substeps 70A and 70B, etching substeps 74A and 74B are not limited to two discrete steps. Instead, these substeps can be performed by three or more discrete steps in the same or difference etching chambers, or alternatively, the steps could represent one or more changes to the etch chemistry without interrupting the etching process. The steps could also be performed by a continuous change to the parameters of the etching chemistry thereby creating a continuous gradient in the etch selectivity throughout the process.

FIG. 4C shows the resulting profile 58 of a PPMSO layer that was developed using a multi-step development process according to the present invention. The improvement in edge roughness can be seen by contrasting profile 58 in FIG. 4C to profile 56 shown in FIG. 4A. In FIG. 4C, edge areas 58B do not taper at the bottom of the PPMSO film to the same extent as they do in the film of FIG. 4A. Hence, as in the case of FIG. 4B, the resulting mask is less "moveable" than the mask in FIG. 4A and edge roughness is improved.

While it has been noted that the multistep deposition technique and multistep etching technique of the present invention provide improved results independent of each other (e.g., as shown in FIGS. 4B and 4C), the currently preferred embodiment of the present invention employs both techniques together and tailors the etching process to the different strata of the PPMS layer. Details of this approach are best understood by referencing FIG. 7.

Figure 7:
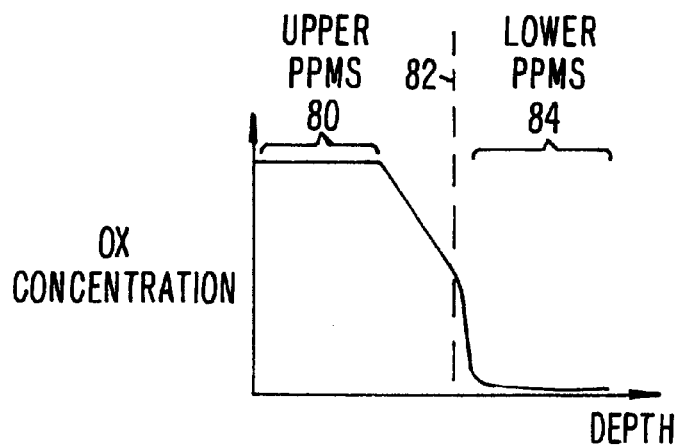
FIG. 7 is a graph illustrating the oxygen concentration of a PPMSO layer after being developed from a two-layer PPMS layer deposited according to the present invention.

FIG. 7 is a graph illustrating the oxygen concentration of a PPMSO layer after being developed from a two-layer PPMS layer deposited according to the present invention. In FIG. 7, the upper PPMS layer is fully oxidized in region 80 and partially oxidized in region 82. The lower PPMS layer, on the other hand, is basically unoxidized as shown by region 84. When developing the PPMS film of FIG. 7, it is advantageous to tailor the etch selectivity of the developing process to each of the regions 80, 82 and 84. The result of such a developing process is shown by profile 59 in FIG. 4D. As evident in FIG. 4D, profile 59 includes the benefits of both the multistep deposition process and multistep development process—vertical edges in area 59A and a stepper angle in are 59B.

In one example used to develop a PPMS having the oxygen concentration shown in FIG. 7 in exposed areas, an etch selectivity of about 2–3:1 is used in a first developing step corresponding to region 80, an etch selectivity of between 4–5:1 is used in a second developing step corresponding to region 82 and an etch selectivity of 5:1 or higher is used per region 84. In another example, an etch selectivity of 4:1 or less is used to develop an upper stratum of the PPMS film while an etch selectivity of 8:1 or more is used to develop the lower stratum. In this example, the middle stratum is developed using an etch selectivity of between about 4–8:1.

The following examples are illustrative of methods for depositing a photosensitive PPMS layer and etching the deposited layer after a DUV exposure and patterning step.

EXAMPLE 1

In the first example, a DxZ chamber manufactured by Applied Materials was used for deposition of the PPMS layer. Initially the pedestal was moved to a position 550 mils from the gas distribution manifold and a 200 sccm flow of argon was introduced into the chamber. The substrate temperature was stabilized by maintaining a chamber pressure of 5 torr and heating the plate to a temperature of 140° C. (a wafer temperature of about 135° C.). This step took about 20 seconds. A 20 second purge step was then employed before deposition gases were introduced into the chamber. The first deposition step included a 20 second stabilization step in which chamber pressure was set at 1.7 torr, wafer temperature was maintained at 140° C. and a 120 sccm flow of $SiH_3CH_3$ was introduced into the chamber; and a 17 second deposition step in which a plasma was formed from the application of 120 Watts of RF energy at a frequency of 13.56 MHz to the upper electrode.

After the first deposition step, the chamber was purged using a 20 second purge step. Then a second deposition step was initiated. In the second deposition step, a 20 second stabilization step set chamber pressure to 2.2 torr, wafer temperature to 140° C. and $SiH_3CH_3$ at 120 sccm. Upon completion of the stabilization step, a plasma was formed and maintained for 47 seconds by applying 60 Watts of RF power as described above. Finally, a 10 second purge step expunged the deposition gases before the wafer was removed from the chamber.

After the PPMS layer was patterned using a 248 nm exposure tool, the substrate was transferred to a high density plasma etcher. In the etcher the exposed PPMS layer was subjected to a three-step etching process in which the etch selectivity of PPMS relative to PPMSO was increased in each step. The etching chemistry employed in the first step had an etch selectivity of about 2:1; the second step had an etch selectivity of between 3–4:1 and the final step employed an etching chemistry having an etch selectivity of greater than 5:1.

Prior to initiating the etching sequence, a 140 sccm $Cl_2$ gas flow was introduced into the chamber and the chamber was stabilized at a pressure of 10 mTorr for about 15 seconds. The first etching step maintained the $Cl_2$ flow and chamber pressure for 6 seconds while applying 50 Watts of RF power (4 MHz) to the bottom electrode of the chamber and 400 Watts of RF power (13.56 MHz) to the top coil to form a chlorine plasma. The second etching step which was endpoint detected, which was started after the etch endpoint was detected in step two, flowed an etching gas including a 70 sccm flow of HBr, a 70 sccm flow of $Cl_2$ and a 6 sccm flow of $O_2$ into the chamber for about 15 seconds while applying RF power of 400 Watts and 50 Watts to the top and bottom coils respectively. The third etching step flowed an etching gas including a 70 sccm flow of HBr, a 70 sccm flow of $Cl_2$ and a 10 sccm flow of $O_2$ into the chamber for about 15 seconds while applying RF power of 400 Watts and 50 Watts to the top and bottom coils respectively. A stabilization step in which the plasma was extinguished was employed between each of the three etching steps.

EXAMPLE 2

In a second example, a single layer PPMS film was deposited as described in U.S. Ser. No. 08/745,565 and the layer was subjected to a multistep etching process after being exposed to DUV radiation.

In Example 2, the multistep etching sequence included two steps. The first step employed an etching chemistry having an etch selectivity of slightly over 2:1 while the second step used a chemistry having an etch selectivity (PPMS/PPMSO) of about 14:1. This change in etch selectivity was done by (1) increasing the source RF power of an Applied Materials' DPS etch chamber from 150 Watts to 300 Watts; (2) increasing the bias RF power from 45 Watts to 60 Watts; and (3) adding a 6 sccm flow of $O_2$ to the etching chemistry. Also, chamber pressure was increased from 4 mTorr to 7 mTorr. Other etching variables remained the same.

The present invention has been described above with respect to several specific examples involving the deposition of PPMS layers. Based on the above description, however, one of ordinary skill in the art will readily realize that the present invention is useful for the deposition of other photosensitive layers including plasma polymerized organosilicon films besides PPMS. Such organosilicon films have the formula $R^1R^2SiH_2$, wherein $R^1$ is an organic moiety, preferably an alkyl or an aryl, and $R^2$ is H or an organic moiety, preferably H, an alkyl, or an aryl. Thus, while methylsilane gas is the presently preferred precursor for forming a plasma polymerized organosilicon film, other silanes including ethylsilane, phenylsilane and the like may also be employed.

Thus, it can be seen that the above description is illustrative and not restrictive. The parameters listed in the above processes and experiments should not be limiting to the claims as described herein. One of ordinary skill in the art can modify the processes described above by using chemicals, chamber parameters, and conditions other than those described with respect to the preferred embodiments and illustrative examples. The scope of the invention should, therefore, be determined not with reference to the above description, but instead should be determined with reference to the appended claims along with their full scope of equivalents.

What is claimed is:

1. A method of developing a patterned photosensitive plasma polymerized organosilicon film deposited over a substrate in a substrate processing chamber, the photosensitive plasma polymerized organosilicon film having an exposed area and an unexposed area, said method comprising etching a first portion of the photosensitive plasma polymerized organosilicon film at a first etch selectivity of the exposed area versus the unexposed area of the photosensitive plasma polymerized organosilicon film and etching a second portion of the photosensitive plasma polymerized organosilicon film, below the first portion, at a second etch selectivity, the second etch selectivity being higher than the first etch selectivity.

2. The method of claim 1 wherein the photosensitive film comprises a plasma polymerized methylsilane film.

3. The method of claim 1 wherein the etch selectivity is increased by altering the composition of an etchant gas used to etch the photosensitive film.

4. The method of claim 1 wherein the first portion of the film is etched at an etch selectivity less than or equal to 4:1 and the second portion of the film is etched at an etch selectivity greater than or equal to 8:1.

5. The method of claim 1 wherein the first portion of the photosensitive plasma polymerized organosilicon film has a first photosensitivity and the second portion of the photosensitive plasma polymerized organosilicon film has a second photosensitivity that is less than the first photosensitivity.

6. The method of claim 1 wherein selected portions of the photosensitive plasma polymerized organosilicon film are oxidized by exposing the film to deep UV radiation in the presence of oxygen prior to the developing the film.

7. The method of claim 6 wherein the photosensitive plasma polymerized organosilicon film is hardened after it is developed by exposing the developed film to an oxygen plasma.

8. A method of developing a patterned photosensitive plasma polymerized organosilicon layer deposited over a substrate in a substrate processing chamber, the photosensitive plasma polymerized organosilicon layer having an exposed area and an unexposed area, said method comprising:

(a) during a first etching stage,
   (i) flowing an etchant gas into the substrate processing chamber;
   (ii) forming a plasma from the etching gas; and
   (iii) maintaining conditions in said substrate processing chamber so that an etch selectivity of the etchant gas for the exposed area versus the unexposed area is less than a selected value;

(b) during a second etching stage, after the first etching stage,
   (i) flowing an etchant gas into the substrate processing chamber;
   (ii) forming a plasma from the etchant gas; and
   (iii) increasing the etch selectivity of the etchant gas;

wherein the photosensitive plasma polymerized organosilicon layer is etched during the first and the second etching stage.

9. The method of claim 8 wherein the etchant gas comprises chlorine during the first and second etching stages.

10. The method of claim 9 wherein the etch selectivity of the etchant gas is increased by increasing a plasma density of the plasma formed in the second stage as compared to a plasma density of the plasma formed in the first stage.

11. The method of claim 8 wherein the etchant gas comprises $Cl_2$, HBr and $O_2$ during the second etching stage.

12. The method of claim 8 wherein the first portion of the film is etched at an etch selectivity less than or equal to 4:1 and the second portion of the film is etched at an etch selectivity greater than or equal to 8:1.

13. The method of claim 8 wherein the photosensitive plasma polymerized organosilicon layer has a first upper strata that has a first photosensitivity and a second lower strata that has a second photosensitivity which is less than the first photosensitivity.

14. The method of claim 8 wherein selected portions of the photosensitive plasma polymerized organosilicon layer are oxidized by exposing the layer to deep UV radiation in the presence of oxygen prior to the developing the layer.

15. The method of claim 8 wherein the photosensitive plasma polymerized organosilicon film is hardened after it is developed by exposing the developed film to an oxygen plasma.

16. A method of developing a patterned photosensitive plasma polymerized organosilicon film, the method comprising:

depositing a photosensitive plasma polymerized organosilicon film over a substrate;

selectively oxidizing portions of the photosensitive plasma polymerized organosilicon layer by exposing portions of the layer to deep UV radiation in the presence of oxygen prior to the developing the layer thereby forming oxidized and nonoxidized regions of the plasma polymerized organosilicon film;

developing the photosensitive plasma polymerized organosilicon film by etching a first strata of the nonxoidized portions of the plasma polymerized organosilicon film using a process that has a first etch selectivity (etch ratio of the nonoxidized region relative to the oxidized region) and etching a second strata, below the first strata, of the nonoxidized portions of the plasma polymerized organosilicon film using a process that has a second etch selectivity which higher than the first etch selectivity.

17. The method of claim 16 wherein the photosensitive plasma polymerized organosilicon film is hardened after it is developed by exposing the film to an oxygen plasma.

* * * * *